(12) United States Patent
Takekoshi (10) Patent No.: US 8,030,626 B2
(45) Date of Patent: Oct. 4, 2011

(54) APPARATUS AND METHOD FOR CHARGED-PARTICLE BEAM WRITING

(75) Inventor: Hidekazu Takekoshi, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 98 days.

(21) Appl. No.: 12/704,911

(22) Filed: Feb. 12, 2010

(65) Prior Publication Data

US 2010/0200773 A1 Aug. 12, 2010

(30) Foreign Application Priority Data

Feb. 12, 2009 (JP) ................. 2009-030291

(51) Int. Cl.
*G21K 5/10* (2006.01)
*G21K 5/04* (2006.01)
*H01J 3/26* (2006.01)

(52) U.S. Cl. ............. 250/492.22; 250/492.1; 250/492.2; 250/492.3; 250/398; 430/296

(58) Field of Classification Search ............. 250/492.22, 250/492.2, 492.1, 492.3, 398; 430/296
See application file for complete search history.

(56) References Cited

U.S. PATENT DOCUMENTS

| 6,566,662 | B1 |  | 5/2003 | Murakami et al. |
| 7,863,586 | B2 | * | 1/2011 | Abe ........................ 250/492.22 |
| 2008/0265174 | A1 | * | 10/2008 | Hiramoto et al. ............. 250/398 |
| 2008/0299490 | A1 | * | 12/2008 | Takekoshi ..................... 430/296 |
| 2009/0032738 | A1 | * | 2/2009 | Takekoshi ................ 250/492.22 |
| 2010/0032588 | A1 | * | 2/2010 | Takekoshi ................ 250/492.22 |

FOREIGN PATENT DOCUMENTS

JP 2008-182073 8/2008

* cited by examiner

*Primary Examiner* — Nikita Wells (74) *Attorney, Agent, or Firm* — Oblon, Spivak, McClelland, Maier & Neustadt, L.L.P.

(57) ABSTRACT

An average write speed M is calculated by averaging write speeds for blocks of a tentative block size La, and write speed variation σ of the blocks with respect to the average write speed M is calculated (Step S12). A maximum speed Vmax is calculated by accelerating and then decelerating (or decelerating and then accelerating) a stage when moving the stage by the width of one of the blocks of the tentative block size La (Step S13). When the relationship "Vmax−M≧σ" does not hold, the tentative block size La is increased (Step S15). When the relationship "Vmax−M≧σ" holds, the tentative block size La is set as an optimal block size Lb (Step S16).

7 Claims, 6 Drawing Sheets

Fig.7

APPARATUS AND METHOD FOR CHARGED-PARTICLE BEAM WRITING

BACKGROUND OF THE INVENTION

1. Field of the Invention

The present invention relates to an apparatus and a method for charged-particle beam writing.

2. Background Art

With larger-scale integration of semiconductor devices, their circuit patterns are being further reduced in size. The formation of microscale circuit patterns on semiconductor devices necessitates the use of high-precision original patterns (i.e., reticles or photomasks), which are fabricated with the use of an electron-beam writing apparatus with high resolution.

Such an electron-beam writing apparatus uses write data that specifies the shapes and positions of circuit patterns to generate shot data for each of strip-shaped writing areas. To write the patterns included in the shot data, the apparatus generates data for each of its main deflector and sub-deflector. The apparatus then actuates its DAC-integrated amplifiers to perform digital-to-analog conversion on each of the deflector data and amplify the resultant signals. Thereafter, the apparatus applies the signals to the main deflector and sub-deflector, thereby writing circuit patterns on a sample.

Pattern writing onto a sample is performed while the apparatus continuously moves its sample stage in X directions. One method for shortening the write time is variable stage speed writing in which the writing system performs writing while varying the speed of its sample stage based on shot density.

A known method for stage speed calculation is to calculate a stage speed for each compartment area (hereinafter abbreviated to "CPM"), which is obtained by sectioning horizontally strip-shaped writing areas in a direction of writing (See Japanese Patent Laid-open No. 2008-182073). According to the method disclosed therein, a stage speed is obtained for each CPM by calculating write time for each CPM based on shot data and dividing each of the calculated write times by the size (or width) of a CPM.

Another method for stage speed calculation is to create multiple blocks by putting a particular number of CPMs together into one block and then calculate a stage speed for each block. According to the method, write times calculated for all the CPMs included in each block are added up to calculate write time for each block. The write time calculated for each block is then divided by the size (width) of a block to calculate a stage speed for each block. This block size is typically a fixed value specified in a writing condition file.

However, when a stage speed is calculated for each block of the size specified in the file, the stage speed difference between two adjacent blocks may increase. As a result, the stage cannot be accelerated during the time period between the end of writing on one of the two blocks and the start of writing on the other. In that case, the calculated stage speeds have to be reduced, and throughput cannot be improved. Thus, block size, which is the conventionally used unit for calculating the speed of a stage in variable stage speed writing, has not been optimal in terms of throughput.

SUMMARY OF THE INVENTION

In view of the above problems, an object of the invention is thus to provide an apparatus and a method for charged-particle beam writing that are capable of optimizing, in terms of throughput, the size of a block, or the unit for calculating the speed of a stage in variable stage speed writing.

According to one aspect of the present invention, in a charged-particle beam writing apparatus for radiating a charged-particle beam onto a writing area of a sample placed on a stage while moving the stage at varied speeds, the stage being movable in two first mutually opposite directions and in two second mutually opposite directions perpendicular to the first directions, the apparatus comprising a write time acquiring unit configured to acquire write time for each of small areas that are obtained by sectioning the entire writing area of the sample in either one of the first directions into strip-shaped areas and further sectioning each of the strip-shaped areas in either one of the second directions, a block size determining unit configured to determine a tentative block size by which to form each of blocks from at least one of the small areas such that each of the blocks includes the same number of small areas and thereafter modifying the tentative block size into an optimal block size with the use of the average write speed of write speeds for the blocks and write speed variation of the blocks with respect to the average write speed so that the write speed variation becomes equal to or less than a predetermined value, a stage speed calculating unit configured to calculate a stage speed for each of blocks of the optimal block size determined by the block size determining unit, and a stage control unit for controlling the movement of the stage based on the stage speeds calculated by the stage speed calculating unit.

According to another aspect of the present invention, in a charged-particle beam writing method for radiating a charged-particle beam onto a writing area of a sample placed on a stage while moving the stage at varied speeds to write patterns on the sample, the stage being movable in two first mutually opposite directions and in two second mutually opposite directions perpendicular to the first directions, write time for each of small areas is acquired that are obtained by sectioning the entire writing area of the sample in either one of the first directions into strip-shaped areas and further sectioning each of the strip-shaped areas in either one of the second directions. A tentative block size is determined by which to form each of blocks from at least one of the small areas. A write speed for each of the blocks of the tentative block size is calculated in order to calculate the average write speed of the write speeds calculated for the blocks, and write speed variation of the blocks with respect to the average write speed is calculated. The tentative block size is modified into an optimal block size so that the write speed variation becomes equal to or less than a predetermined value. A stage speed is calculated for each of blocks of the optimal block size. The patterns are written while moving the stage at the calculated stage speeds.

DETAILED DESCRIPTION OF THE EMBODIMENTS

A embodiment of the invention will now be described in detail with reference to the accompanying drawings.

Figure 1:
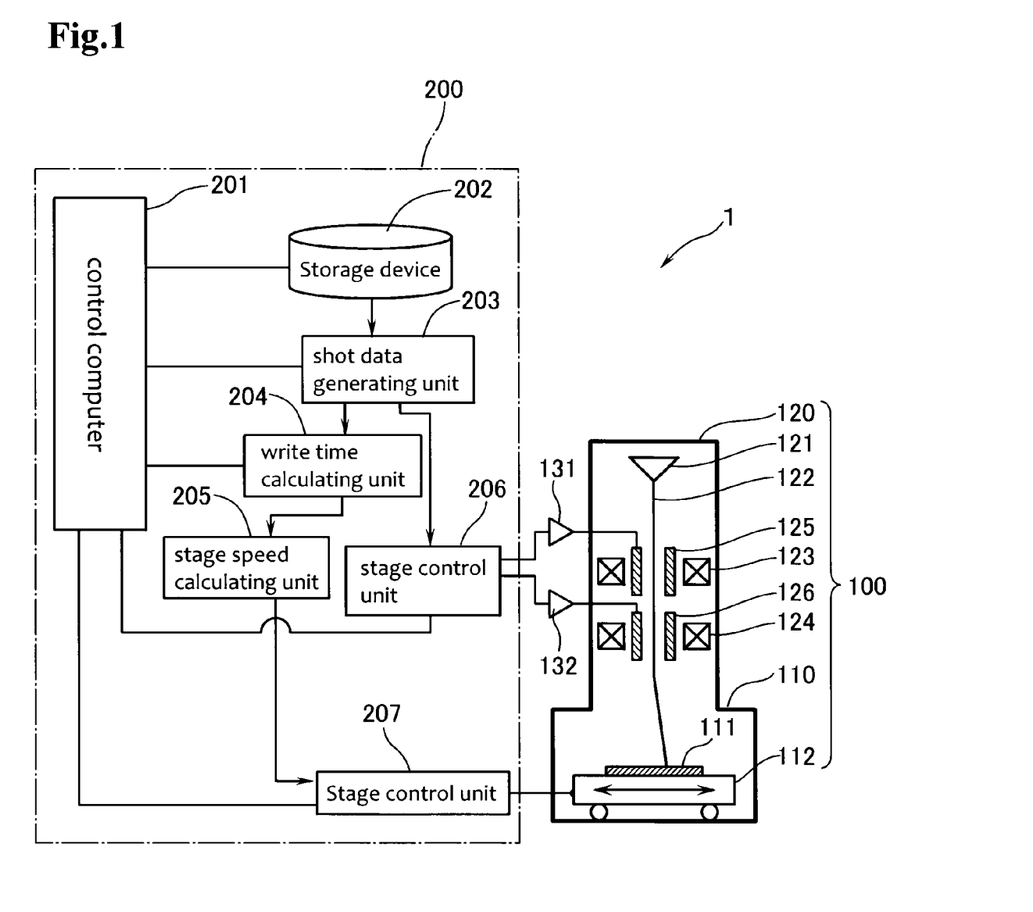
FIG. 1 is a diagram illustrating the configuration of an electron-beam writing apparatus according to an embodiment of the invention.

FIG. 1 is a diagram illustrating the configuration of an electron-beam writing apparatus according to the embodiment. The electron-beam writing apparatus of FIG. 1, designated by reference numeral 1, includes a writing section 100 and a control section 200.

The writing section 100 comprises a sample chamber 110 and an electron optical column 120 placed on the sample chamber 110. The sample chamber 110 houses a stage 112 having a sample 111 (i.e., a photomask) placed thereon. The stage 112 is driven under the control of a stage control unit 207, which will be described later, and moves in X directions (the right and left directions of FIG. 1) and Y directions (the front and back directions of FIG. 1). The position of the stage 112 is measured by a well-known laser interferometer or the like (not illustrated).

The electron optical column 120 houses an electron gun 121; lenses 123 and 124; a main deflector 125 and a sub-deflector 126, which are used for beam scanning; and the like.

The main deflector 125 is used to deflect an electron beam 122 emitted from the electron gun 121 onto a particular sub-field (i.e., a sub-deflection area) on the sample 111. The sub-deflector 126 is used to perform beam positioning within the subfield based on a pattern to be written.

Connected to the main deflector 125 is a DAC-integrated amplifier 131 that performs digital-to-analog conversion on a main deflector signal received from a deflection control unit 206, described later, and amplifies the resultant signal. Connected to the sub-deflector 126 is a DAC-integrated amplifier 132 that performs digital-to-analog conversion on a sub-deflector signal received from the deflection control unit 206 and amplifies the resultant signal.

Figure 2:
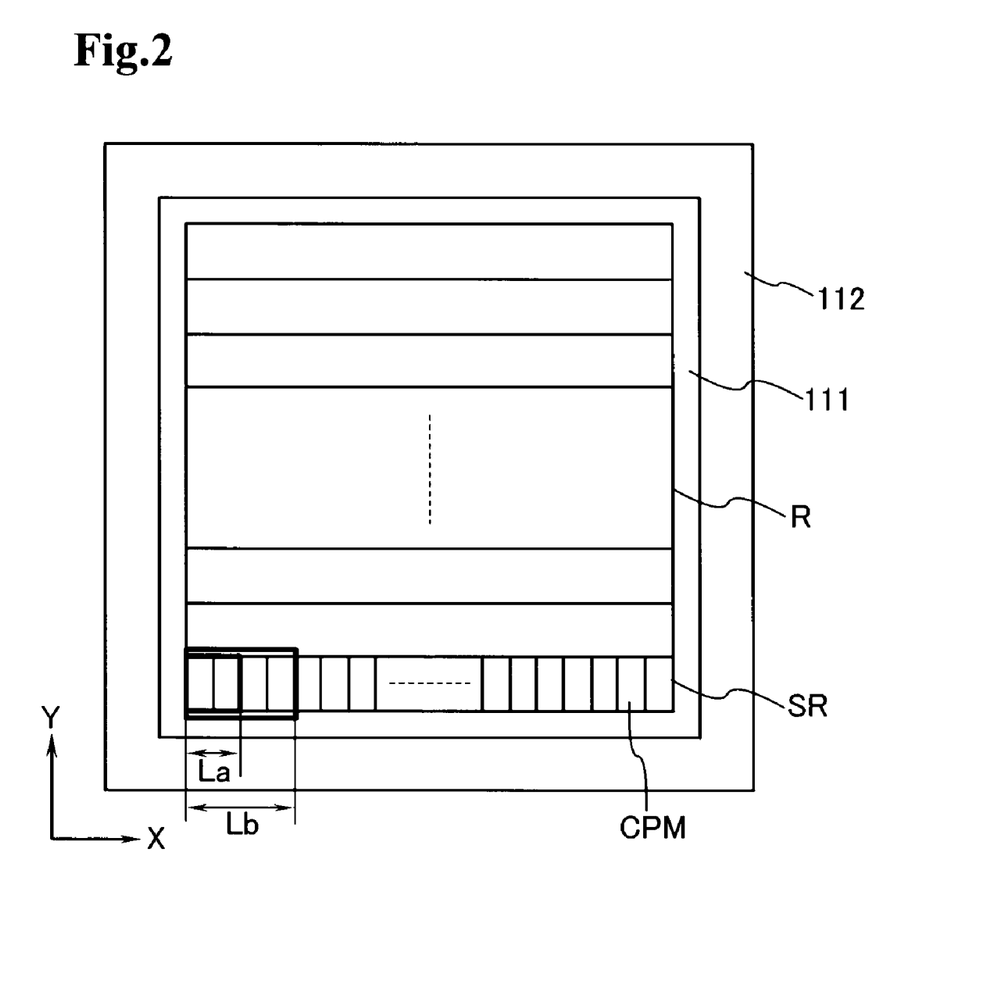
FIG. 2 is a diagram illustrating CPMs obtained by sectioning a horizontally strip-shaped writing area SR in the X direction of FIG. 2, a tentative block size La, and an optimal block size Lb.

The electron-beam writing apparatus 1 performs electron-beam writing by first moving the stage 112 continuously in the negative X direction of FIG. 2 (to the left of FIG. 2). As illustrated in FIG. 2, the writing is performed on horizontally strip-shaped writing areas SR (also referred to as "frame areas") that are obtained by sectioning the entire writing area R of the sample 111 in the Y direction of FIG. 2 into horizontal (i.e., X-directional) strips based on the deflection width of the main deflector 125. During the writing process, the speed of the stage 112 is changed based on shot density. Once writing for the bottom writing area SR of FIG. 2 has been complete, the stage 112 is moved stepwise in the negative Y direction that is perpendicular to the negative X direction. The writing process is then resumed by moving the stage 112 continuously in the positive X direction. By repeating the above process, a pattern is sequentially written in each of the writing areas SR.

The control section 200 includes the following components: a control computer 201 that controls the overall operation of the electron-beam writing apparatus 1; a storage device 202 (e.g., a magnetic hard disk drive) connected via a bus to the control computer 201; a shot data generating unit 203; a write time calculating unit 204; a stage speed calculating unit 205; the deflection control unit 206 mentioned above; and the stage control unit 207 mentioned above. The storage device 202 stores write data for writing LSI circuit patterns. The write data specifies the shapes and positions of the circuit patterns.

The shot data generating unit 203 reads from the storage device 202 the write data, which is necessary for writing patterns in the strip-shaped writing areas SR, and divides the patterns specified by the write data on a shot-by-shot basis, thereby creating shot data. Based on the shot data, the deflection control unit 206 generates a main deflector signal and a sub-deflector signal used for controlling the main deflector 125 and the sub-deflector 126, respectively.

The write time calculating unit 204 calculates write time for each CPM (see FIG. 2), which is obtained by sectioning one of the horizontally strip-shaped writing areas SR in the X direction of FIG. 2 at given intervals (e.g., 90 μm), and generates write time data (hereinafter also referred to as "CPM data") that specifies the write time for each CPM.

Figure 3:
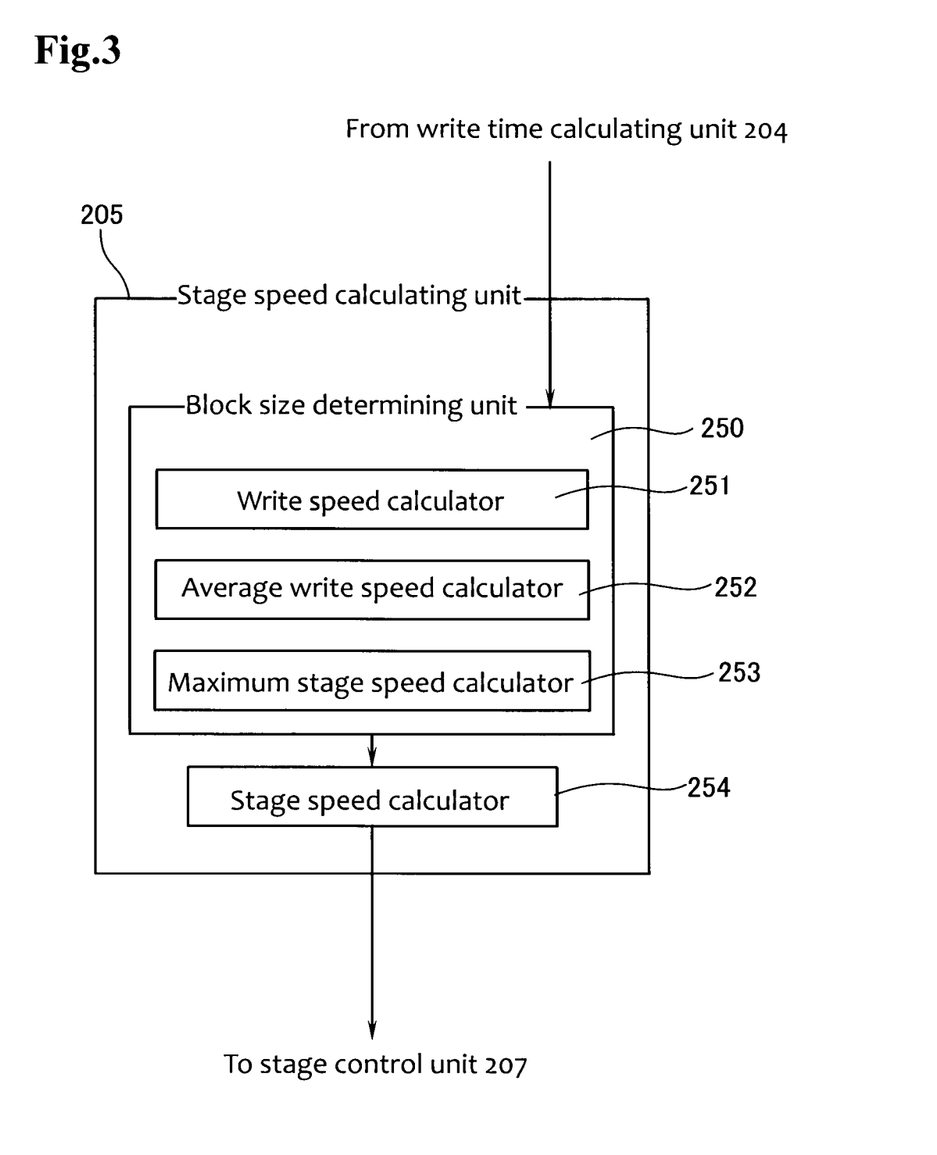
FIG. 3 is a diagram illustrating the configuration of the stage speed calculating unit 205 of FIG. 1.

As illustrated in FIG. 3, the stage speed calculating unit 205, which is a distinctive feature of the invention, includes a block size determining unit 250 that determines the size of a block, or the unit for calculating the speed of the stage 112.

The block size determining unit 250 determines a tentative block size La by which to form each block from a particular number of CPMs (at least one CPM) and thereafter modifies the tentative block size La into an optimal block size Lb (See FIG. 2). The block size determining unit 250 includes a write speed calculator 251, an average write speed calculator 252, and a maximum stage speed calculator 253.

The write speed calculator 251 calculates a write speed for each block that has the tentative block size La and includes a particular number of CPMs determined by that size La. The number of CPMs included in each block is the same.

The average write speed calculator 252 calculates an average write speed M by averaging the write speeds calculated for all the blocks by the write speed calculator 251 and also calculates write speed variation σ of the blocks with respect to the average write speed M. The write speed variation σ can be calculated with the use of a normal or uniform distribution function.

Figure 7:
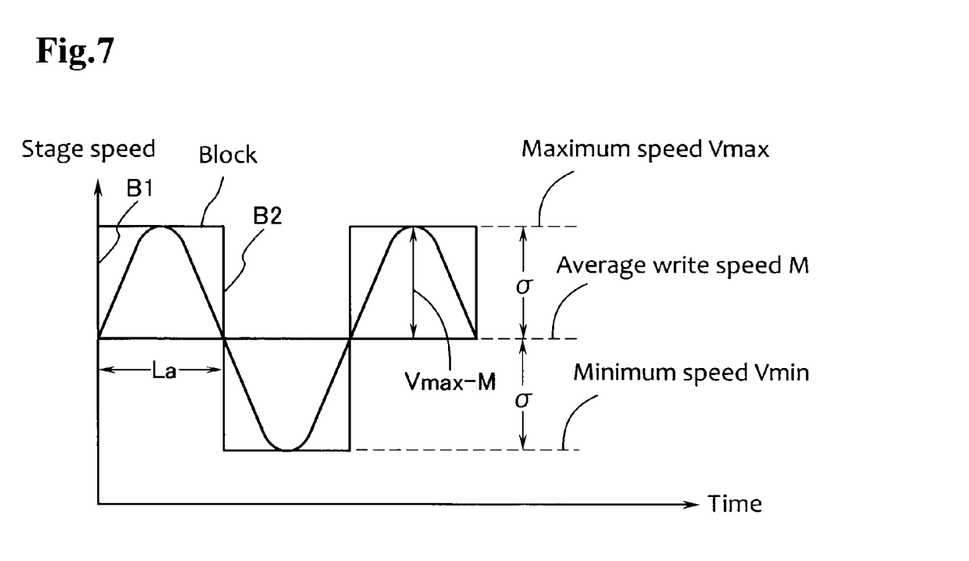
FIG. 7 is a diagram illustrating stage speed changes when Vmax−M=σ.

The maximum stage speed calculator 253 calculates a maximum stage speed Vmax (or a minimum stage speed Vmin). This calculation is done by moving the stage 112 in the positive or negative X direction of FIG. 2 such that, as shown in FIG. 7, the stage 112 travels the distance from the edge B1 of a block of the tentative block size La to the opposite edge B2 of the block, starting the travel at the average write speed M, next accelerating, and then decelerating (next decelerating, and then accelerating) to end the travel at the average write speed M, and the maximum stage speed calculator 253 calculates the maximum stage speed Vmax (or the minimum stage speed Vmin) during that time. The maximum stage speed Vmax can be obtained by Formula (1) below, where "Acc" is the acceleration of the stage 112, "Ts" the acceleration time of the stage 112, "La" the tentative block size, and "M" the average write speed. The minimum stage speed Vmin can also be obtained by the same formula. The explanation that follows is based on the assumption that the maximum stage speed Vmax is calculated.

$$Vmax = \frac{-Acc \cdot Ts + \sqrt{4Acc \cdot La + Acc^2 \cdot Ts^2 + 4M^2 - 4Acc \cdot Ts \cdot M}}{2} \quad (1)$$

As will be discussed later more in detail, the block size determining unit 250 modifies the tentative block size La into the optimal block size Lb based on "Vmax−M," which is obtained by subtracting the average write speed M from the maximum speed Vmax, or "M−Vmin," which is obtained by subtracting the minimum speed Vmin from the average write speed M, and its relationship with the write speed variation σ. In other words, the block size determining unit 250 modifies the tentative block size La so that the write speed variation σ is equal to or less than "Vmax−M." This allows modification of the tentative block size La into the optimal block size Lb that leads to the shortest write time to write patterns in the strip-shaped writing areas SR.

As illustrated in FIG. 3, the stage speed calculating unit 205 also includes a stage speed calculator 254. The stage speed calculator 254 calculates a stage speed for each block of the optimal block size Lb obtained by the block size determining unit 250.

Discussed next is data processing performed by the control unit 200.

When the control computer 201 issues a shot generation command to the shot data generating unit 203, the shot data generating unit 203 reads from the storage device 202 the write data necessary for writing circuit patterns in a particular one of the writing areas SR. The shot data generating unit 203 then generates shot data by dividing the patterns specified by the write data on a shot-by-shot basis.

After the shot data generation, the write time calculating unit 204 generates CPM data that specifies write time for each CPM, based on the shot data received from the shot data generating unit 203. Alternatively, the write time calculating unit 204 can also be allowed to provide CPM data prepared in advance.

The block size determining unit 250 inside the stage speed calculating unit 205 then calculates a write speed for each block of the tentative block size La, using the CPM data for the particular one of the strip-shaped writing areas SR. The block size determining unit 250 also calculates the average write speed M by averaging the write speeds calculated for all the blocks and then calculates the write speed variation σ of the blocks with respect to the average write speed M. Thereafter, the block size determining unit 250 modifies the tentative block size La into the optimal block size Lb so that the write speed variation σ becomes equal to or less than a predetermined value ("Vmax−M").

The stage speed calculator 254 then acquires the optimal block size Lb from the block size determining unit 250, thereby calculating a stage speed for each block of the optimal block size Lb.

Figure 4:
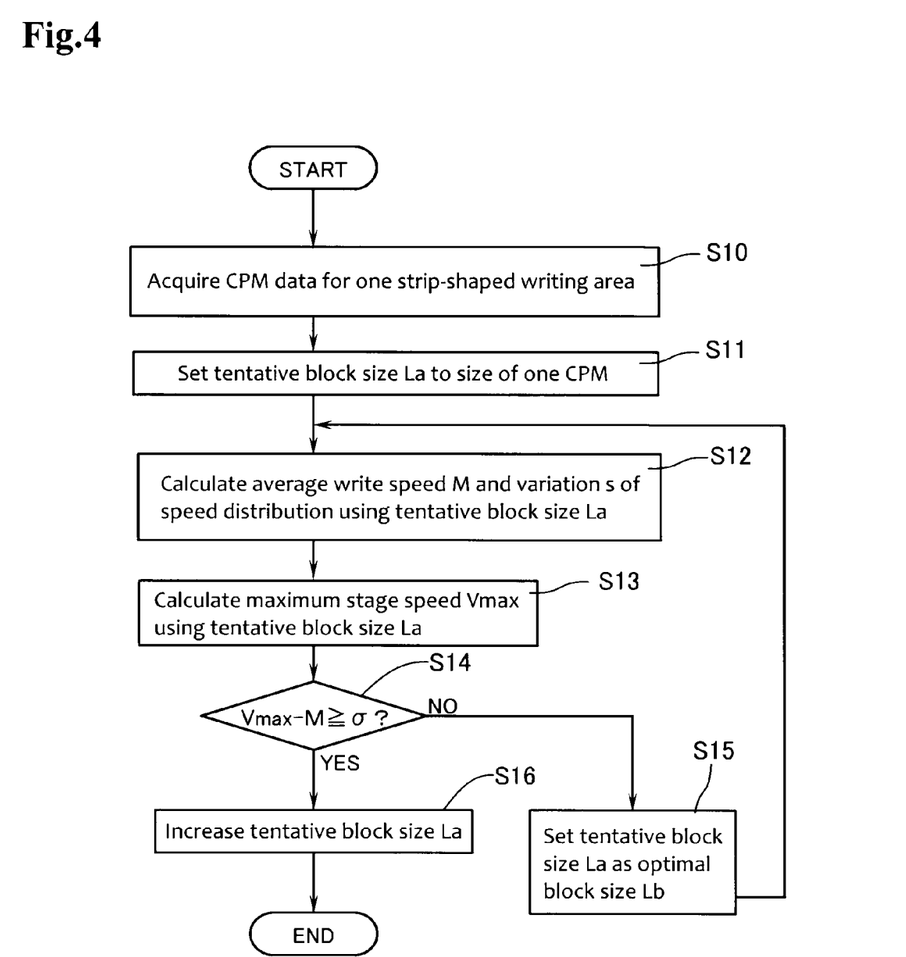
FIG. 4 is a flowchart illustrating a method for calculating the optimal block size Lb according to the embodiment.

Described next with reference to FIG. 4 is a method for calculating the optimal block size Lb by the block size determining unit 250.

As illustrated in FIG. 4, the block size determining unit 250 first acquires CPM data for one of the strip-shaped writing areas SR (Step S10). The block size determining unit 250 then sets the tentative block size La to the size of one CPM (Step S11). In this example, the tentative block size La is the smallest since one block is allowed to include only one CPM. When the size (or X-directional length) of each CPM is 90 μm, for example, the tentative block size La is also 90 μm.

Figure 5:
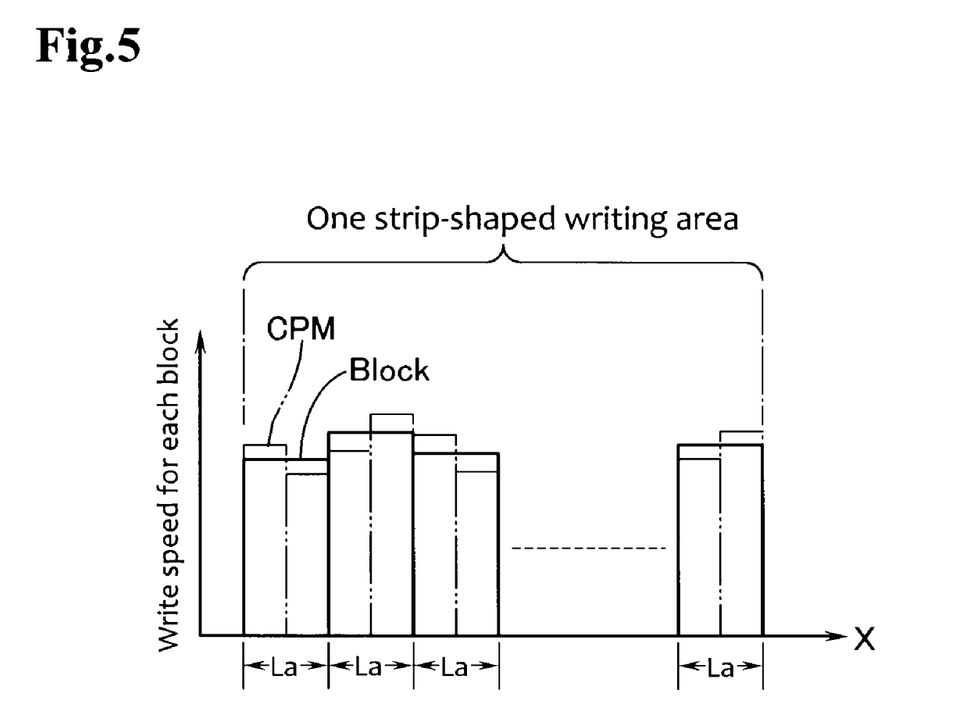
FIG. 5 is a diagram illustrating multiple blocks created by grouping CPMs with the tentative block size La.

In Step S12, the block size determining unit 250 calculates the average write speed M and the write speed variation σ, using the tentative block size La set in Step 11 or the tentative block size La increased in Step S15, which will be described later. During Step S12, CPMs are first grouped based on the tentative block size La, thereby creating multiple blocks. While Step S11 of FIG. 4 is based on the assumption that the tentative block size La is the size of one CPM, FIG. 5 illustrates an example in which the tentative block size La is 180 μm and multiple blocks are created by putting two CPMs together into one block. In FIG. 5, the height of a CPM represents write time (write speed).

Next, the block size determining unit 250 calculates a write speed for each of the blocks of the tentative block size La. This calculation is done by adding up all the write times calculated for the CPMs included in each of the blocks and dividing the respective sums by the tentative block size La. The block size determining unit 250 then calculates the average write speed M by averaging the write speeds calculated for all the blocks. The block size determining unit 250 also calculates the write speed variation σ of the blocks with respect to the average write speed M by using a normal or uniform distribution function.

Then in Step S13, the block size determining unit 250 calculates the maximum stage speed Vmax in one of the blocks of the tentative block size La based on the above Formula 1.

In Step S14, the block size determining unit 250 judges whether the relationship "Vmax−M≧σ" holds, that is, whether the write speed variation σ is equal to or less than "Vmax−M."

Figure 6:
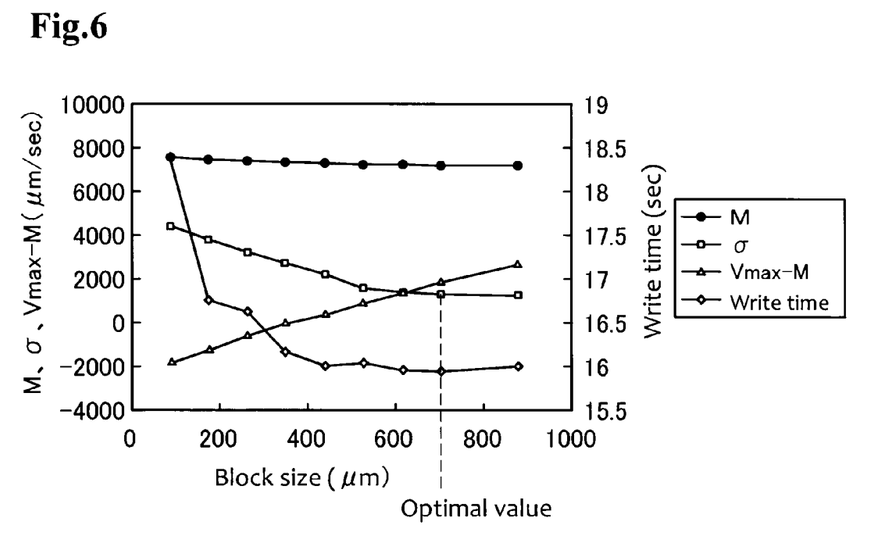
FIG. 6 is a graph showing the relationships of block size with an average write speed M, variation σ, a maximum stage speed Vmax minus the average write speed M, and write time.

FIG. 6 shows the relationships of block size with the average write speed M, the variation σ, the maximum stage speed Vmax minus the average write speed M, and write time required for one strip-shaped writing area SR. As shown in FIG. 6, with increasing block size from a minimum of 90 μm, the average write speed M and the variation σ decrease gradually, and the maximum stage speed Vmax increases gradually. Thus, "Vmax−M" increases gradually, making the difference between "Vmax−M" and the variation σ smaller. Once the relationship "Vmax−M≧σ" holds, the variation σ is equal to or less than "Vmax−M," and the difference between the variation σ and "Vmax−M" is the smallest. The block size at this point is the optimal block size Lb that leads to the shortest write time.

FIG. 7 shows stage speed changes when Vmax−M=σ. Changing the stage speed as illustrated in FIG. 7, that is, modifying the tentative block size La so that Vmax−M=σ, results in the highest possible efficiency in moving the stage for writing and an improvement in throughput.

However, it is not always the case that the relationship "Vmax−M=σ" holds even if the tentative block size La is changed. The reason is that the tentative block size La is a multiple of the size of a CPM, i.e., takes a natural number.

Therefore, the present embodiment is designed to determine the tentative block size La when Vmax−M≧σ as the optimal block size Lb that leads to the shortest write time (Step S16). In the example of FIG. 6, the optimal block size Lb is 720 μm.

After the optimal block size Lb is determined, the stage speed calculator 254 regroups CPMs with the use of the optimal block size Lb to create multiple blocks and then calculates a stage speed (i.e., a command value) for each of the blocks using the stage acceleration Acc and the stage acceleration time Ts. After the calculated stage speeds are transmitted to the stage control unit 207, the movement of the stage 112 is controlled. At the same time, a main deflector signal and a sub-deflector signal generated by the deflection control unit 206 based on shot data are transmitted respectively to the main deflector 125 and the sub-deflector 126 via the amplifiers 131 and 132. This initiates pattern writing onto the sample 111.

When, on the other hand, the block size determining unit 250 judges the relationship "Vmax−M≧σ" to be not valid in Step S14, or when the variation σ is greater than "Vmax−M," the block size determining unit 250 increases the tentative block size La (Step S15). In Step S15, the number of CPMs included in a block is increased by one; thus, the tentative block size La increases by the size of a CPM. When the tentative block size La is, for example, 90 μm, it is increased to 180 μm in Step S15 if the relationship "Vmax−M≧σ" does not hold in Step S14. Step S15 is then followed by Step S12.

As described above, the present embodiment is designed to modify the tentative block size La into the optimal block size Lb so that the write speed variation σ of each block with respect to the average write speed M becomes equal to or less than a predetermined value and then calculate a stage speed for each block of the optimal block size Lb. Thus, writing throughput can be improved in comparison with the case where a stage speed is calculated for each block of a fixed block size.

Now assume that the size of each CPM is 80 μm and the X-directional length of a strip-shaped writing area SR is 160 mm. In that case, the writing area SR can be sectioned into 2,000 CPMs, and the tentative block size La can be set to a multiple of a CPM, i.e., to 80 μm, 160 μm, 240 μm, . . . , or 160 mm. A possible method for calculating the optimal block size Lb in that case to make write time the shortest is to calculate a stage speed for each block and its associated write time. However, this method imposes a larger calculation load on the writing apparatus, and it takes a longer time to obtain the optimal block size Lb. As a result, throughput may be decreased. In contrast, the present embodiment is only required to determine the tentative block size La when Vmax−M≧σ as the optimal block size Lb. Thus, the optimal block size Lb can be obtained more easily.

It should be noted that the present invention is not limited to the above embodiment but can be embodied in other various forms without departing from the scope of the invention. For example, while the above embodiment adopts the use of electron beams, the invention is not limited thereto. Other charged-particle beams such as ion beams or the like can instead be used.

Further, while the shot data generating unit 203 and the write time calculating unit 204 of the above embodiment are discrete units, the shot data generating unit 203 can instead include the write time calculating unit 204 therein.

Moreover, the components of the above embodiment that have been termed "unit" can be either hardware or software (i.e., computer programs).

The features and advantages of the present invention may be summarized as follows.

In a first aspect of the invention, a tentative block size is modified into an optimal block size with the use of the average write speed of write speeds calculated for all blocks and write speed variation of the blocks with respect to the average write speed so that the write speed variation becomes equal to or less than a predetermined value, and a stage speed is then calculated for each block of the optimal block size. Thus, throughput can be improved in comparison with the case where a stage speed is calculated for each block of a fixed block size.

In a second aspect of the invention, an average write speed is calculated by averaging write speeds calculated for all blocks, and write speed variation of the blocks with respect to the average write speed is then calculated. A tentative block size is modified into an optimal block size so that the write speed variation becomes equal to or less than a predetermined value, and a stage speed is calculated for each block of the optimal block size. Thus, throughput can be improved in comparison with the case where a stage speed is calculated for each block of a fixed block size.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2009-030291, filed on Feb. 12, 2009 including specification, claims, drawings and summary, on which the Convention priority of the present application is based, are incorporated herein by reference in its entirety.

What is claimed is:

1. A charged-particle beam writing apparatus for radiating a charged-particle beam onto a writing area of a sample placed on a stage while moving the stage at varied speeds, the stage being movable in two first mutually opposite directions and in two second mutually opposite directions perpendicular to the first directions, the apparatus comprising:
    a write time acquiring unit configured to acquire write time for each of small areas that are obtained by sectioning the entire writing area of the sample in either one of the first directions into strip-shaped areas and further sectioning each of the strip-shaped areas in either one of the second directions;
    a block size determining unit configured to determine a tentative block size by which to form each of blocks from at least one of the small areas such that each of the blocks includes the same number of small areas and thereafter modifying the tentative block size into an optimal block size with the use of the average write speed of write speeds for the blocks and write speed variation of the blocks with respect to the average write speed so that the write speed variation becomes equal to or less than a predetermined value;
    a stage speed calculating unit configured to calculate a stage speed for each of blocks of the optimal block size determined by the block size determining unit; and
    a stage control unit configured to control the movement of the stage based on the stage speeds calculated by the stage speed calculating unit.

2. The charged-particle beam writing apparatus according to claim 1, wherein the block size determining unit acquires a maximum speed (or minimum speed) of the stage that is calculated while the stage is being moved in either one of the second directions such that the stage travels the distance from one edge of a block of the tentative block size to the opposite edge of the block, starting the travel at the average write speed, next accelerating, and then decelerating (next decelerating, and then accelerating) to end the travel at the average write speed and
    wherein the predetermined value is obtained by subtracting the average write speed from the maximum speed (or subtracting the minimum speed from the average write speed).

3. The charged-particle beam writing apparatus according to claim 2, wherein the block size determining unit modifies the tentative block size into the optimal block size so that the difference between the write speed variation and the maximum speed minus the average write speed (or the average write speed minus the minimum speed) becomes the smallest.

4. A charged-particle beam writing method for radiating a charged-particle beam onto a writing area of a sample placed on a stage while moving the stage at varied speeds to write patterns on the sample, the stage being movable in two first mutually opposite directions and in two second mutually opposite directions perpendicular to the first directions, the method comprising:

acquiring write time for each of small areas that are obtained by sectioning the entire writing area of the sample in either one of the first directions into strip-shaped areas and further sectioning each of the strip-shaped areas in either one of the second directions;

determining a tentative block size by which to form each of blocks from at least one of the small areas;

calculating a write speed for each of the blocks of the tentative block size in order to calculate the average write speed of the write speeds calculated for the blocks and calculate write speed variation of the blocks with respect to the average write speed;

modifying the tentative block size into an optimal block size so that the write speed variation becomes equal to or less than a predetermined value;

calculating a stage speed for each of blocks of the optimal block size; and writing the patterns while moving the stage at the calculated stage speeds.

5. The method according to claim 4, wherein the modifying the tentative block size into the optimal block size comprises:

calculating a maximum speed (or minimum speed) of the stage while the stage is being moved in either one of the second directions such that the stage travels the distance from one edge of a block of the tentative block size to the opposite edge of the block, starting the travel at the average write speed, next accelerating, and then decelerating (next decelerating, and then accelerating) to end the travel at the average write speed; and obtaining the predetermined value by subtracting the average write speed from the maximum speed (or subtracting the minimum speed from the average write speed).

6. The method according to claim 5, wherein the modifying the tentative block size into the optimal block size is performed so that the difference between the write speed variation and the maximum speed minus the average write speed (or the average write speed minus the minimum speed) becomes the smallest.

7. The method according to claim 5, wherein when the write speed variation is greater than the predetermined value, the modifying the tentative block size into the optimal block size further comprises:

increasing the tentative block size to calculate a write speed for each of blocks of the increased tentative block size; and calculating write speed variation of the blocks of the increased tentative block size based on the average write speed of the write speeds calculated for the blocks of the increased tentative block size and wherein the increasing the tentative block size and the calculating the write speed variation of the blocks of the increased tentative block size are repeated until the write speed variation becomes equal to or less than the predetermined value.

* * * * *